(12) United States Patent
Mulder et al.

(10) Patent No.: US 12,184,296 B2
(45) Date of Patent: Dec. 31, 2024

(54) SYSTEMS AND METHOD OF COMPENSATING FOR NONLINEAR CAPACITANCE IN CONVERTERS

(71) Applicant: AVAGO TECHNOLOGIES INTERNATIONAL SALES PTE. LIMITED, Singapore (SG)

(72) Inventors: Jan Mulder, Houten (NL); Frank Van der Goes, Zeist (NL); Mohammadreza Mehrpoo, Eindhoven (NL); Sijia Wang, Utrecht (NL)

(73) Assignee: Avago Technologies International Sales Pte. Limited, Singapore (SG)

( * ) Notice: Subject to any disclaimer, the term of this patent is extended or adjusted under 35 U.S.C. 154(b) by 286 days.

(21) Appl. No.: 17/950,567

(22) Filed: Sep. 22, 2022

(65) Prior Publication Data
US 2024/0106446 A1 Mar. 28, 2024

(51) Int. Cl.
*H03M 1/06* (2006.01)
*H03M 1/10* (2006.01)

(52) U.S. Cl.
CPC ........ *H03M 1/0604* (2013.01); *H03M 1/1014* (2013.01); *H03M 1/1042* (2013.01)

(58) Field of Classification Search
CPC .................................................. H03M 1/0604
See application file for complete search history.

(56) References Cited

U.S. PATENT DOCUMENTS 10,425,091 B2 * 9/2019 Jain ........................ H03L 7/1976

OTHER PUBLICATIONS

Chengzhou Wang, L. E. Larson and P. M. Asbeck, "A nonlinear capacitance cancellation technique and its application to a CMOS class AB power amplifier," 2001 IEEE Radio Frequency Integrated Circuits (RFIC) Symposium (IEEE Cat. No.01CH37173), 2001, pp. 39-42, doi: 10.1109/RFIC.2001.935637.

* cited by examiner

*Primary Examiner* — Joseph J Lauture
(74) *Attorney, Agent, or Firm* — Foley & Lardner LLP (57) ABSTRACT

Described herein are systems and methods related to a converter includes a number of unit cells. The unit cells each include a first transistor and a second transistor. The first transistor is coupled in series with an output of the unit cell, and the second transistor is configured to have a capacitive characteristic that reduces a non-linear capacitive characteristic of the first transistor. The converter can be a voltage or current mode digital to analog converter.

19 Claims, 7 Drawing Sheets

SYSTEMS AND METHOD OF COMPENSATING FOR NONLINEAR CAPACITANCE IN CONVERTERS

BACKGROUND

The present disclosure relates generally to signal converters including but not limited to digital-to-analog convertors (DACs) used in radio frequency (RF) systems. DACs, such as current steering DACs operating at high signal frequencies, can suffer degraded performance due at least in part to the non-linear nature of parasitic capacitance at the output.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Referring generally to the FIGURES, an example DAC includes a number of DAC cells. In some embodiments, systems and methods provide compensation for non-linear output capacitance (e.g., due to process, voltage, and temperature (PVT) variations). In some embodiments, systems and methods provide compensation for current-steering DACs operating at high signal frequencies that suffer from performance degradation due to the non-linearity of the parasitic capacitances of output transistors. In some embodiments, the non-linear output capacitance is associated with a cascode transistor at the output of the DAC cell. A cascode transistor is a device employed to shield components of the DAC (e.g., a current source in the DAC cell or the switch transistor in the DAC cell). The cascode transistor can be a switch that attenuates output swing such that the signal swing is larger at the drain of the cascode transistor which is coupled to the output than at the source of the cascode transistor in some embodiments. Therefore, the cascode transistor is configured to reduce the output swing (e.g., the range of the output signal) as experienced by the switch transistor.

In some embodiments, systems and methods make the DAC less susceptible to a large output signal swing which, in combination with capacitive non-linearity, degrades the spurious free dynamic range (SFDR) and increases the third order intermodulation distortion (IM3) of the DAC. In some embodiments, systems and methods provide one or more nonlinear capacitors configured to provide the opposite nonlinearity characteristic with respect to the non-linearity characteristic of the gate-drain parasitic capacitance (Cgd) of the cascode transistor. The combined non-linearity effect is much smaller than the original non-linearity characteristic of the cascode transistor, thereby improving overall linearity in some embodiments. A non-linear capacitive characteristic refers to a response where the change of the capacitance is not directly proportional to the change of an input criteria. The input criteria can be voltage, temperature, process variation, etc.

In some embodiments, multiple compensation capacitors are embodied as compensation transistors in each cell. In some embodiments, the compensation transistors can have various sizes and bias voltages to reduce the non-linearity of the cascode transistors or reach an optimized non-linearity response. The systems and methods compensate for the gate-drain parasitic capacitance at the cell which increases as drain voltage decreases and vice versa in a non-linear fashion. A unit cell as used herein refers to a unit circuit having a set of components in a particular arrangement. A unit cell may be a DAC cell. Each DAC cell may be configured to receive a corresponding one bit of multiple bits of data, and to provide a current corresponding to the received one bit. In some embodiments, each DAC cell may be configured to receive a number of bits and to provide a current or voltage corresponding to the received bits. In one aspect, currents or voltages from different DAC cells can be combined to represent the multiple bits of data. For example, an amplitude of the combined current in an analog representation may correspond to the multiple bits of data in a digital representation. In one aspect, compensation is provided for each DAC cell to reduce errors in performing a digital-to-analog conversion.

In one aspect, the DAC is implemented for a wireless communication. For example, the DAC can be implemented in a transmitter for a radio frequency (RF) communication, such as a cellular communication (3G, 4G, 5G, 6G, etc.), Wi-Fi communication, Bluetooth communication, etc. In some embodiments, the transmitter is a transmitter of a base station (e.g., eNode B (eNB), gNodeB (gNB), etc.) that provides a wireless communication. In one aspect, the DAC may operate at a high speed (e.g., over 5 Gbps), and may convert a modulated signal at radio frequency in a digital representation into an analog signal in an analog representation. The DAC may provide the analog signal to a preamplifier or a power amplifier for transmission through an antenna, such that an analog upconverter or an analog mixer can be omitted. By omitting the analog upconverter or the analog mixer, the transmitter can reduce power consumption, and can be implemented in a small form factor. Moreover, modulation or upconversion of a signal in a baseband frequency (e.g., 100 MHz~1 GHz) to a RF frequency (1~10 GHz) can be performed by a digital logic circuit that may be less susceptible to noise than an analog circuit, such that the transmitter can improve a signal quality. Although the DAC disclosed herein is provided for a transmitter for a wireless communication, the DAC can be implemented for different applications. For example, the DAC disclosed herein can be implemented for a wired communication, an optical communication, or any computing device that performs high speed digital-to-analog conversion.

In some embodiments, one or more components can be embodied, in whole or part, as one or more transistors. The transistors implemented may be N-type transistors or P-type transistors. N-type transistor is a transistor that utilizes electrons as majority carriers. P-type transistor is a transistor that utilizes holes as majority carriers. The transistors can be any suitable type of transistors including, but not limited to, metal oxide semiconductor field effect transistors (MOSFETs), bipolar junction transistors (BJTs), high voltage transistors, high frequency transistors, FinFETs, planar MOS transistors with raised source/drains, nanosheet FETs, nanowire FETs, or the like. Furthermore, one or more transistors shown or described herein can be embodied as two or more transistors connected in parallel. In one aspect, a transistor includes a source electrode, a drain electrode and a gate electrode. A source electrode and a drain electrode can be interchangeable, according to voltages applied to the source electrode and the drain electrode. Hence, a source electrode and a drain electrode can be referred to as source/drain electrodes herein. According to a voltage applied to a gate electrode of the transistor, current may flow between a source electrode and a drain electrode. In certain application, a transistor can be implemented as a switch. For example, if a voltage difference between a gate electrode and a source electrode of a transistor is larger than a threshold voltage of the transistor, the transistor can be enabled to electrically couple between the source electrode and the drain electrode of the transistor. For example, if a voltage difference between a gate electrode and a source electrode of a transistor is less than a threshold voltage of the transistor, the transistor can be disabled to electrically decouple between the source electrode and the drain electrode of the transistor.

Some embodiments relate to a converter that includes a number of unit cells. The unit cells each include a first transistor and a second transistor. The first transistor is coupled in series with an output of the unit cell, and the second transistor is configured to have a capacitive characteristic that reduces a non-linear capacitive characteristic of the first transistor.

In some embodiments, the unit cells are voltage or current mode DAC cells. In some embodiments, the first and second transistors are each N-channel transistors or are each P-channel transistors. In some embodiments, a gate of the second transistor is coupled to the output.

In some embodiments, the gate of the second transistor is coupled to the output and a bias circuit is coupled to a drain of the second transistor and source of the second transistor which are coupled together. In some embodiments, the second transistor and the bias circuit receive a signal at the output. In some embodiments, a gate of the second transistor is coupled to the output and a bias circuit is coupled between a drain of the second transistor and source of the second transistor. In some embodiments, the non-linear capacitive characteristic of the first transistor is associated with a parasitic gate drain capacitance.

In some embodiments, the unit cells each comprise a third transistor. The third transistor is coupled to another output of the unit cell, and the third transistor is configured to have a capacitive characteristic that reduces a non-linear capacitive characteristic of the second transistor. In some embodiments, the first transistor is a cascode transistor.

In some embodiments, the unit cells each include a third transistor coupled in series with first transistor. The first transistor and the third transistor are cascode transistors, and the first transistor is between the third transistor and the output.

Some embodiments relate to a converter. The converter includes a number of unit cells. The unit cells each include a first transistor, a second transistor, a third transistor, a fourth transistor, a first capacitive element and a second capacitive element. The first transistor is configured to drive a signal at a first output, and the second transistor is configured to drive a signal at a second output. The third transistor is configured to reduce an output swing experienced by the first transistor. The fourth transistor is configured to reduce an output swing experienced by the second transistor. The first capacitive element is configured to have a capacitive characteristic that reduces a non-linear capacitive characteristic of the first transistor, and the second capacitive element is configured to have a capacitance characteristic that reduces a non-linear capacitive characteristic of the second transistor.

In some embodiments, the unit cells are current mode digital to analog converter cells, and the first capacitive element and the second capacitive element are each N-channel transistors or are each P-channel transistors. In some embodiments, the gate of the first capacitive element is coupled to the first output, and a first bias circuit is coupled between a drain of the first capacitive element and source of the second capacitive element.

In some embodiments, the gate of the first capacitive element is coupled to the second output, and a second bias circuit is coupled between a drain of the first capacitive element and source of the second capacitive element. In some embodiments, the first capacitive element and the second capacitive element are N-channel transistors. Capacitive elements refer to any devices that have or can be configured to have a capacitive response. Capacitive elements include active and passive devices, including but not limited to diodes, transistors, and capacitors. A capacitive characteristic or capacitive response refers to a capacitive property of a device that occurs across values of another variable such as voltage, temperature, process variations, etc.

Some embodiments relate to a method of reducing a nonlinear capacitive response of converter including a number of unit cells. The unit cells each include a first transistor and a second transistor. The first transistor is coupled in series with a first output of the unit cell. The second transistor is coupled in series with a second output of the unit cell. The method includes biasing a first active element so that the first active element has a capacitive characteristic that reduces a non-linear capacitive characteristic of the first transistor. The method also includes biasing a second active element so that the second active element has a capacitive characteristic that reduces a non-linear capacitive characteristic of the second transistor.

In some embodiments, the first active element is a transistor configured as a capacitor. In some embodiments, the method further includes biasing a third active element so that the third active element has a capacitive characteristic that reduces a non-linear capacitive characteristic of the first active element. In some embodiments, the first active element is biased using an output signal at the first output.

Figure 1:
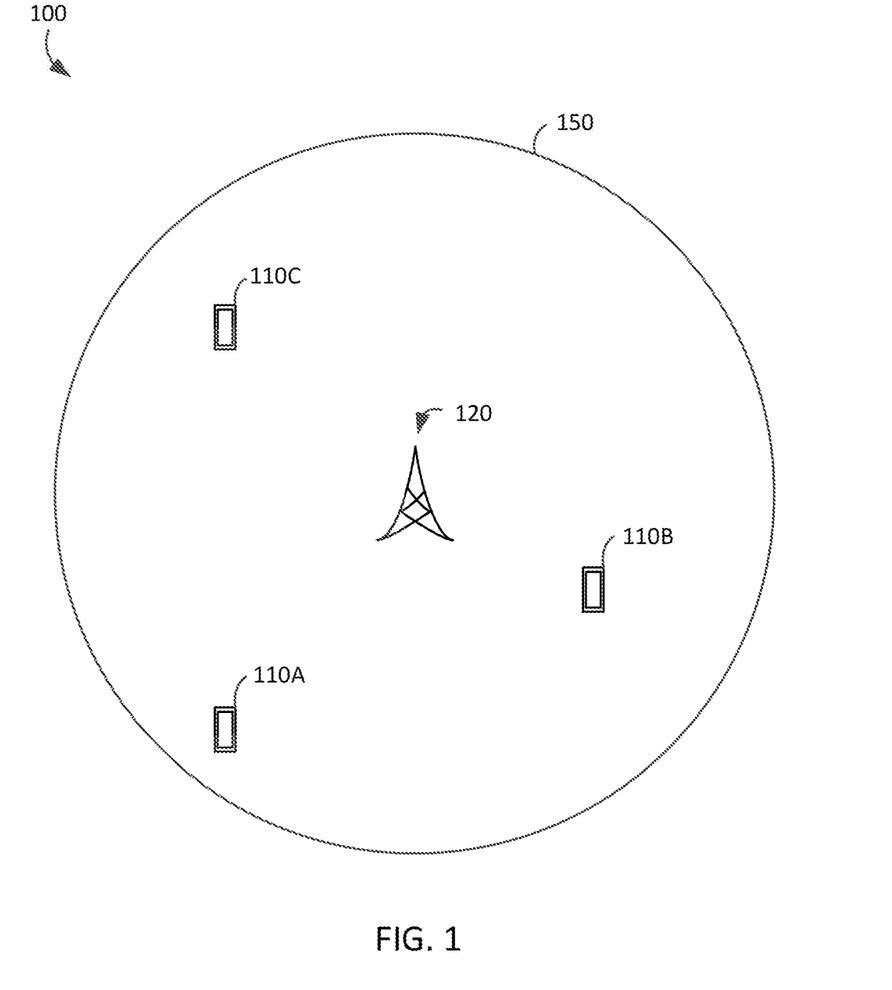
FIG. 1 is a schematic block diagram of a communication system including a base station and client devices, in accordance with some embodiments.

FIG. 1 illustrates a communication system 100 including a base station 120 and client devices 110A, 110B, 110C, in accordance with some embodiments. The base station 120 and the client devices 110A, 110B, 110C may communicate through a wireless communication link. A wireless communication link may be a cellular communication link conforming to 3G, 4G, 5G, 6G, or other cellular communication protocols. In one aspect, the client devices 110A . . . 110C are located within a geographical boundary 150 with respect to the base station 120, and may communicate with or through the base station 120. In some embodiments, the communication system 100 includes more, fewer, or different number of base stations 120 and/or client devices 110 than shown in FIG. 1.

In some embodiments, the client device 110 may be a user device such as a mobile phone, a smart phone, a personal digital assistant (PDA), tablet, laptop computer, wearable computing device (e.g., head mounted display, smart watch), etc. A client device 110 may be also referred to as user equipment (UE). Each client device 110 may communicate with the base station 120 through a corresponding communication link. For example, the client device 110 may transmit or provide a wireless signal at RF to a base station 120 through a wireless communication link (e.g., 3G, 4G, 5G, 6G or other cellular communication link), and/or receive a wireless signal at RF from the base station 120 through the wireless communication link (e.g., 3G, 4G, 5G, 6G or other cellular communication link). A wireless signal may be a signal exchanged or provided through a wireless medium (e.g., air). The wireless signal may include or carry data such as video data, audio data, image data, text, etc.

In some embodiments, the base station 120 may be a device configured to provide a wireless communication to client devices 110 within a geographical boundary 150. Examples of the base station include eNB, gNB, etc. The base station 120 may be communicatively coupled to another base station 120 or other communication devices through a wireless communication link and/or a wired communication link. The base station 120 may receive a wireless signal at RF from a client device 110 or another base station 120 through a wireless communication link. Additionally or alternatively, the base station 120 may transmit or provide a wireless signal at RF to another client device 110, another base station 120, or another communication device through a wireless communication link. Hence, the base station 120 allows communication among client devices 110 associated with the base station 120, or other client devices 110 associated with different base stations 120.

Figure 2:
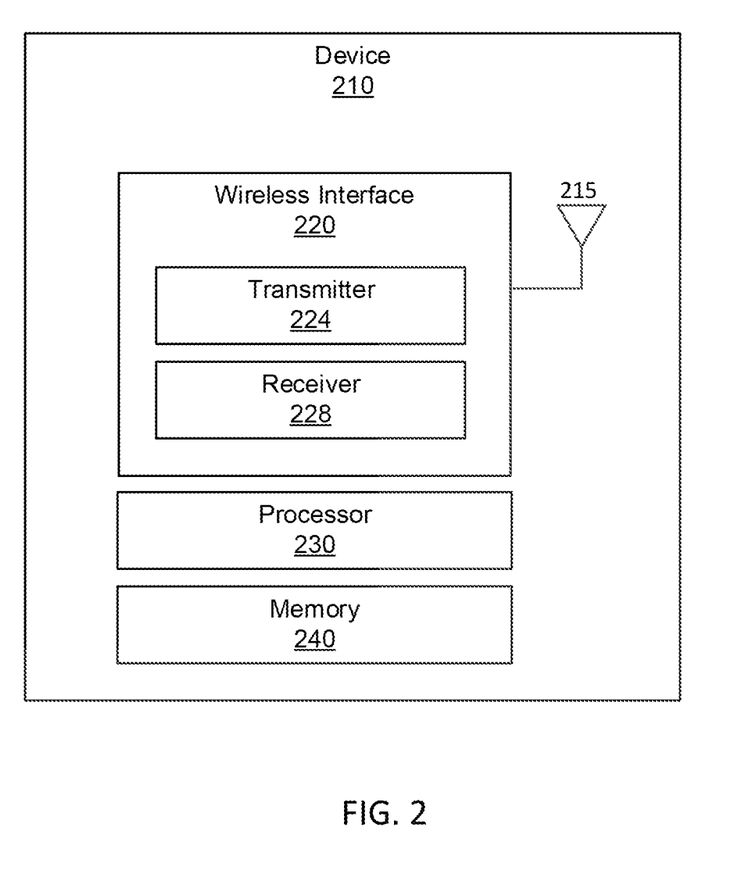
FIG. 2 is a schematic block diagram of a device for communication through a wireless communication link, in accordance with some embodiments.

FIG. 2 illustrates a block diagram of a device 210 for communication through a wireless communication link, in accordance with some embodiments. In some embodiments, the device 210 may be the base station 120, the client device 110, or any device that can communicate through a wireless communication link. In some embodiments, the device 210 includes an antenna 215, a wireless interface 220, a processor 230, and a memory device 240. These components may be embodied as hardware, software, firmware, or a combination thereof. In some embodiments, the device 210 includes more, fewer, or different components than shown in FIG. 2. For example, the device 210 may include an electronic display and/or an input device. For example, the device 210 may include additional antennas 215 and additional wireless interfaces 220 than shown in FIG. 2.

In some embodiments, the antenna 215 is a component that may receive a wireless signal at RF and/or transmit a wireless signal at RF through a wireless medium (e.g., air). The antenna 215 may be a dipole antenna, a patch antenna, a ring antenna, or any suitable antenna for wireless communication. In one aspect, a single antenna 215 is utilized for both transmitting a wireless signal and receiving a wireless signal. For receiving a wireless signal, the antenna 215 may detect a wireless signal having a change in an electromagnetic wave in a wireless medium (e.g., air), and provide, to the wireless interface 220, an electrical signal at RF having a voltage and/or a current corresponding to the detected change in the electromagnetic wave. An electrical signal at RF may be referred to as a RF signal herein. For transmitting a wireless signal, the antenna 215 may receive, from the wireless interface 220, an electrical signal at RF having a voltage and/or a current, and transmit, through the wireless medium (e.g., air), a wireless signal having a change in an electromagnetic wave corresponding to the electrical signal. In some embodiments, different antennas 215 can be utilized for transmitting the wireless signal and receiving the wireless signal. In some embodiments, multiple antennas 215 can be utilized to support multiple-in, multiple-out (MIMO) communication.

In some embodiments, the wireless interface 220 is a circuit or a component that may provide a RF signal to the antenna 215 or receive a RF signal from the antenna 215. In some embodiments, the wireless interface 220 includes a transmitter 224 and a receiver 228. In some embodiments, the transmitter 224 and the receiver 228 may be implemented in a same integrated circuit. In some embodiments, the transmitter 224 and the receiver 228 may be implemented in different integrated circuits. A transmitter 224 may be a circuit or a component that generates or provides a RF signal for transmitting data. In one aspect, the transmitter 224 may receive a baseband signal including or representing data (e.g., audio data, image data, text, or any data) for transmission at a baseband frequency (e.g., 0~1 GHz) from the processor 230, and upconvert the baseband signal to generate a RF signal. The transmitter 224 may provide the RF signal to an antenna 215 for transmission. A receiver 228 may be a circuit or a component that receives a RF signal for receiving data. In one aspect, the receiver 228 may receive a RF signal at the RF from an antenna 215, and downconvert the RF signal to a baseband frequency (e.g., 0~1 GHz) to obtain a downconverted signal at the baseband frequency. The downconverted signal at the baseband frequency may include or represent data (e.g., audio data, image data, text, or any data) generated by another device (e.g., another base station 120, another client device 110, etc.). The receiver 228 may provide the downconverted signal to the processor 230. In one configuration, the transmitter 224 and the receiver 228 may be coupled to the same antenna 215. In one configuration, the transmitter 224 and the receiver 228 may be coupled to different antennas 215.

The processor 230 is a component that processes data. The processor 230 may be embodied as FPGA, ASIC, a logic circuit, etc. The processor 230 may obtain instructions from the memory device 240, and execute the instructions. In one aspect, the processor 230 may receive the downconverted signal at the baseband frequency from the wireless interface 220, and decode or process data included in or represented by the downconverted signal. For example, the processor 230 may obtain audio data or image data from the downconverted signal. In one aspect, the processor 230 may generate or obtain data for transmission at the baseband frequency, and encode or process the data. For example, the processor 230 may encode or process image data or audio data at the baseband frequency, and provide a baseband signal including or representing the encoded or processed data to the wireless interface 220 for transmission.

The memory device 240 is a component that stores data. The memory device 240 may be embodied as RAM, flash memory, ROM, EPROM, EEPROM, registers, a hard disk, a removable disk, a CD-ROM, or any device capable for storing data. The memory device 240 may be embodied as a non-transitory computer readable medium storing instructions executable by the processor 230 to perform various functions of the device 210 disclosed herein. In some embodiments, the memory device 240 and the processor 230 are integrated as a single component (or an integrated circuit). In some embodiments, the memory device 240, the processor 230, and the wireless interface 220 are integrated as a single component (or an integrated circuit). In some embodiments, the memory device 240, the processor 230, and the wireless interface 220 are implemented as discrete components (or separate integrated circuits).

Figure 3:
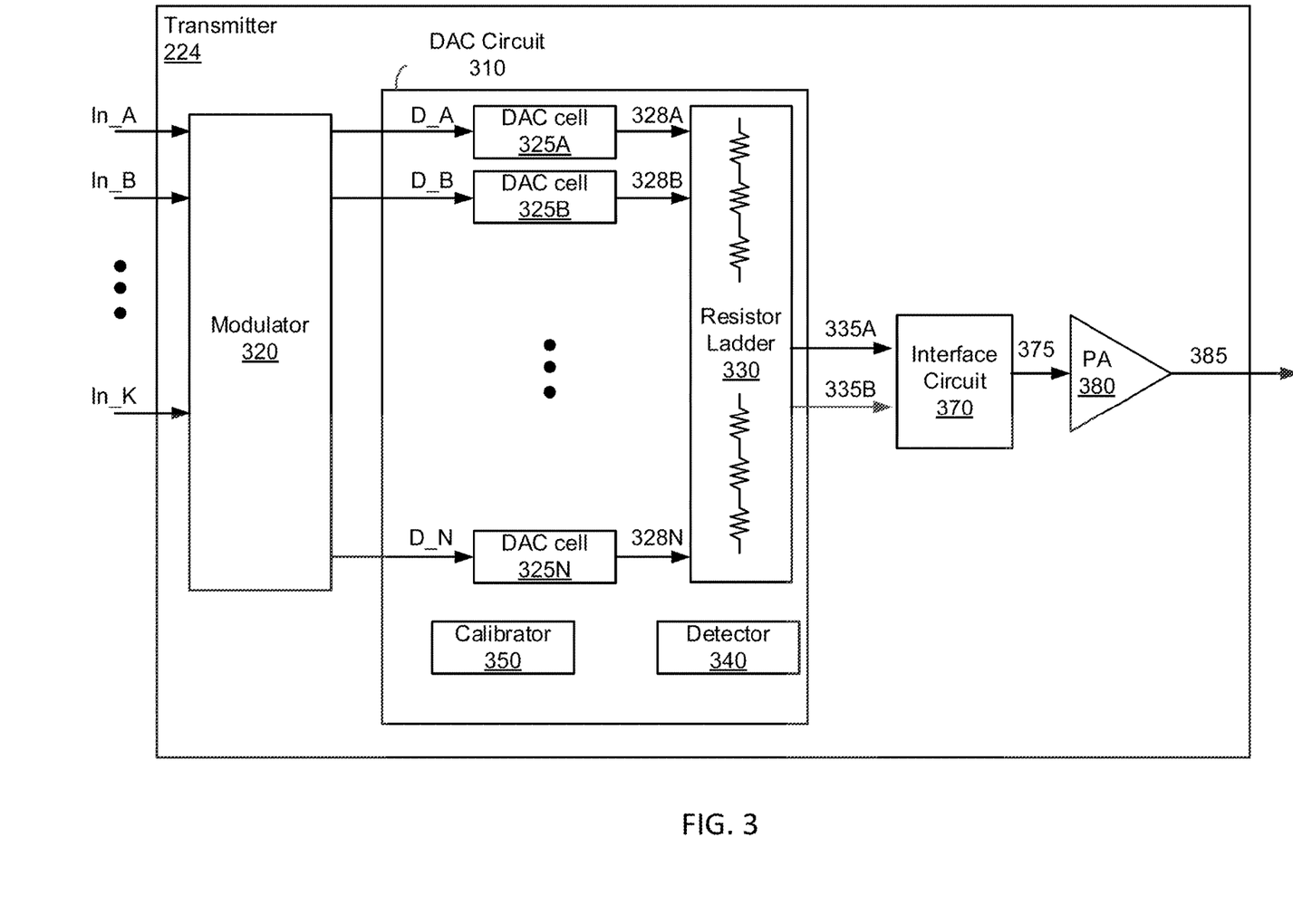
FIG. 3 is a schematic block diagram of a transmitter including a DAC, in accordance with some embodiments.

FIG. 3 illustrates a schematic diagram of a transmitter 224, in accordance with some embodiments. In some embodiments, the transmitter 224 includes a DAC 310 (also referred to as "a DAC circuit 310"), a modulator 320, an interface circuit 370, and a power amplifier (PA) 380. These components may operate together to generate a RF signal 385 for transmission. In one aspect, the modulator 320 operates in a digital domain, where the interface circuit 370 and the PA 380 operate in an analog domain. The DAC circuit 310 may operate in both the analog domain and the digital domain, and may operate as an interface between the modulator 320 operating in the digital domain and the interface circuit 370 and the PA 380 operating in the analog domain. In some embodiments, the transmitter 224 includes more, fewer, or different components than shown in FIG. 3. For example, the modulator 320 may be implemented as part of the processor 230. Although DAC circuit 310 is shown as part of transmitter 224, DAC circuit 310 can be employed in other devices including but not limited to optical devices (e.g., optical transceivers or sensors) and computing devices.

In some embodiments, the modulator 320 is a circuit or a component that may receive a baseband signal including K-bit data In_A . . . In_K in a digital representation, and perform modulation or upconversion on the K-bit data In_A . . . In_K. A modulation or an upconversion may be multiplying a value represented by the K-bit data In_A . . . In_K by a sine function or a cosine function of a carrier frequency at RF. A carrier frequency may be a frequency (e.g., 2 GHz or 60 GHz), at which a wireless signal can be transmitted. In one approach, the modulator 320 can perform multiplication of the value represented by the K-bit data In_A . . . In_K and the sine function or the cosine function of the carrier frequency by a digital logic circuit to obtain N-bit data D_A . . . D_N representing an upconverted signal at RF. The modulator 320 may provide the N-bit data D_A . . . D_N in a digital representation to the DAC circuit 310.

In some embodiments, the DAC circuit 310 is a circuit or a component that may perform a digital-to-analog conversion. In some embodiments, the DAC circuit 310 includes a plurality of DAC cells 325A . . . 325N, a resistor ladder 330, a detector 340, and a calibrator 350. These components may operate together to receive N-bit data D_A . . . D_N in a digital representation, and provide signals 335A, 335B in an analog representation corresponding to the N-bit data D_A . . . D_N. For example, voltage amplitudes of the signals 335A, 335B may represent or correspond to a value of the N-bit data D_A . . . D_N. In some embodiments, the DAC circuit 310 includes more, fewer, or different components than shown in FIG. 3.

In some embodiments, a DAC cell 325 is a circuit or a component that may receive one bit data D, and generate an output 328 corresponding to the one bit data D. In one configuration, the DAC cell 325 includes an input port coupled to the modulator 320, and an output port coupled to a corresponding resistor of the resistor ladder 330. A port may be a pad, a metal rail, or any conductive component that can receive or provide an electrical signal (e.g., a voltage or a current). An input port may be a port to receive a signal, where an output port may be a port to provide or output a signal. In this configuration, a DAC cell 325 may receive a one bit data D, and provide an output 328 having an amplitude corresponding to the one bit data D. For example, in response to the one bit data D having a value '0', the DAC cell 325 may bypass providing a current. For example, in response to the one bit data D having a value '1', the DAC cell 325 may provide an output 328 having a certain amplitude to the resistor ladder 330. Detailed description on exemplary implementations and operations of the DAC cell 325 is provided below with respect to FIG. 4. DAC circuit 310 is a voltage mode or current mode DAC in some embodiments. A current mode DAC is a DAC that accumulates current from DAC cells 325A . . . 325N to provide the analog output and can be a unary current DAC. A voltage mode DAC is a DAC that selects voltage outputs from a circuit (e.g., a resistive ladder) to provide the analog output.

In some embodiments, the resistor ladder 330 is a circuit or a component that can provide voltage signals 335A, 335B corresponding to outputs 328A . . . 328N from a set of DAC cells 325A . . . 325N. In one configuration, the resistor ladder 330 includes various resistors connected in an R-2R configuration. In one configuration, output ports of different DAC cells 325A can be coupled to corresponding resistors of the resistor ladder 330. In one configuration, the resistor ladder 330 includes output ports coupled to input ports of the interface circuit 370. In this configuration, the resistor ladder 330 can combine currents or outputs 328A . . . 328N from the set of DAC cells 325, and generate or provide voltage signals 335A, 335B corresponding to the combined current. The voltage signals 335A, 335B may be differential signals having opposite phases with each other. In one aspect, an amplitude of the combined current corresponds to amplitudes of the voltage signals 335A, 335B. For example, for '0001' of 4-bit input data corresponding to a value '1', a difference in amplitudes of the voltage signals 335A, 335B may be 100 mV corresponding to a current from a single DAC cell 325. For example, for '0111' of 4-bit input data corresponding to a value '3', a difference in amplitudes of the voltage signals 335A, 335B may be 300 mV corresponding to currents from three DAC cells 325. The resistor ladder 330 may provide the voltage signals 335A, 335B at its output ports.

In some embodiments, the detector 340 is a circuit or a component that may detect an error in one or more DAC cells 325. The detector 340 can be implemented as an analog circuit, a digital logic circuit, or a combination of the analog circuit and the digital logic circuit. In one configuration, the detector 340 includes one or more input ports coupled to the resistor ladder 330, and an output port coupled to an input port of the calibrator 350. In this configuration, the detector 340 can detect characteristics of one or more DAC cells 325. Examples of characteristics of a DAC cell 325 include a timing of providing an output signal at output 328, an amplitude at the output 328, etc. The detector 340 may generate one or more feedback signals indicating the detected characteristics of a DAC cell 325, and provide the one or more feedback signals to the calibrator 350.

In some embodiments, the calibrator 350 is a circuit or a component that can perform calibration of DAC cells 325. In one aspect, each DAC cell 325 may have errors due to a process corner variation, a voltage variation, a temperature variation, or a combination of them. Examples of errors may include a timing error and an amplitude error. For example, timing errors or differences in timing of providing outputs 328A . . . 328N by different DAC cells 325 can cause errors in combining currents or outputs 328A . . . 328N from different DAC cells 325, and may cause inaccuracy in generating the voltage signals 335A, 335B corresponding to N-bit data. For example, if a particular DAC cell 325 provides an output 328 later than other DAC cells 325 or does not provide a output 328 at a time period allocated for providing the output 328, then the output 328 from the DAC cell 325 may not be combined properly, and may cause the amplitudes of the voltage signals 335A, 335B to represent a wrong value of a N-bit data. For example, amplitude errors or differences in amplitudes of outputs 328A . . . 328N provided by different DAC cells 325A . . . 325N can cause errors in an amplitude of the combined current from different DAC cells 325A . . . 325N, and may cause inaccuracy in amplitudes of the voltage signals 335A, 335B generated based on the combined current. For example, if a particular DAC cell 325 provides an output 328 having an amplitude less than or larger than amplitudes of outputs 328 from other DAC cells 325, then the amplitudes of the voltage signals 335A, 335B generated based on the combined current may represent a wrong value of a N-bit data. In one aspect, the calibrator 350 can configure or adjust each DAC cell 325 to reduce timing errors and amplitude errors. DAC cells 325A-325N can be voltage mode or current mode DAC cells.

In one aspect, the calibrator 350 may receive one or more feedback signals indicative of characteristics of one or more DAC cells 325 from the detector 340, and adjust a configuration or setting of each DAC cell 325 according to the one or more feedback signals. Examples of configuration or setting of a DAC cell 325 include a configuration to adjust a drive strength of generating or providing the output 328 and/or a configuration to adjust an amplitude of the output 328. The calibrator 350 may determine a target configuration or a target setting of each DAC cell 325, and provide a configuration signal indicating the determined configuration or setting to each DAC cell 325. For example, if the calibrator 350 determines, based on one or more feedback signals, that a particular DAC cell 325 is slower than other DAC cells 325, the calibrator 350 may generate a configuration signal causing the DAC cell 325 to increase a drive strength to provide the output 328 faster. For example, if the calibrator 350 determines, based on one or more feedback signals, that a particular DAC cell 325 provides an output 328 with an amplitude larger than amplitudes of outputs 328 provided by other DAC cells 325, the calibrator 350 may generate a configuration signal causing the DAC cell 325 to provide the output 328 with a lower amplitude.

In some embodiments, the interface circuit 370 is a circuit or a component that may interface between the DAC circuit 310 and the PA 380. Examples of the interface circuit 370 include a balun, an impedance matching circuit, etc. In one configuration, the interface circuit 370 includes a first input port coupled to a first output port of the resistor ladder 330, a second input port coupled to a second output port of the resistor ladder 330, and an output port coupled to an input port of the PA 380. In this configuration, the interface circuit 370 may convert differential signals 335A, 335B into a signal 375. For example, the interface circuit 370 may obtain a difference in amplitudes of the signals 335A, 335B, and provide the difference as the signal 375. In one aspect, the interface circuit 370 may provide impedance matching between the DAC circuit 310 and the PA 380, such that the input port of the PA 380 may have a certain impedance within a range (e.g., 40~60 ohm) to ensure that the PA 380 can operate properly.

In some embodiments, the PA 380 is a circuit or a component that can amplify the signal 375 to obtain the RF signal 385 for driving the antenna 215. In some embodiments, the PA 380 includes a single amplifier circuit or two or more amplifier circuits connected in cascade. In one configuration, the PA 380 includes an input port coupled to an output port of the interface circuit 370, and an output port coupled to the antenna 215. In this configuration, the PA 380 can amplify an amplitude of the signal 375 to obtain the RF signal 385 having an amplified amplitude, and provide the RF signal 385 to the antenna 215 for transmission.

Figure 4:
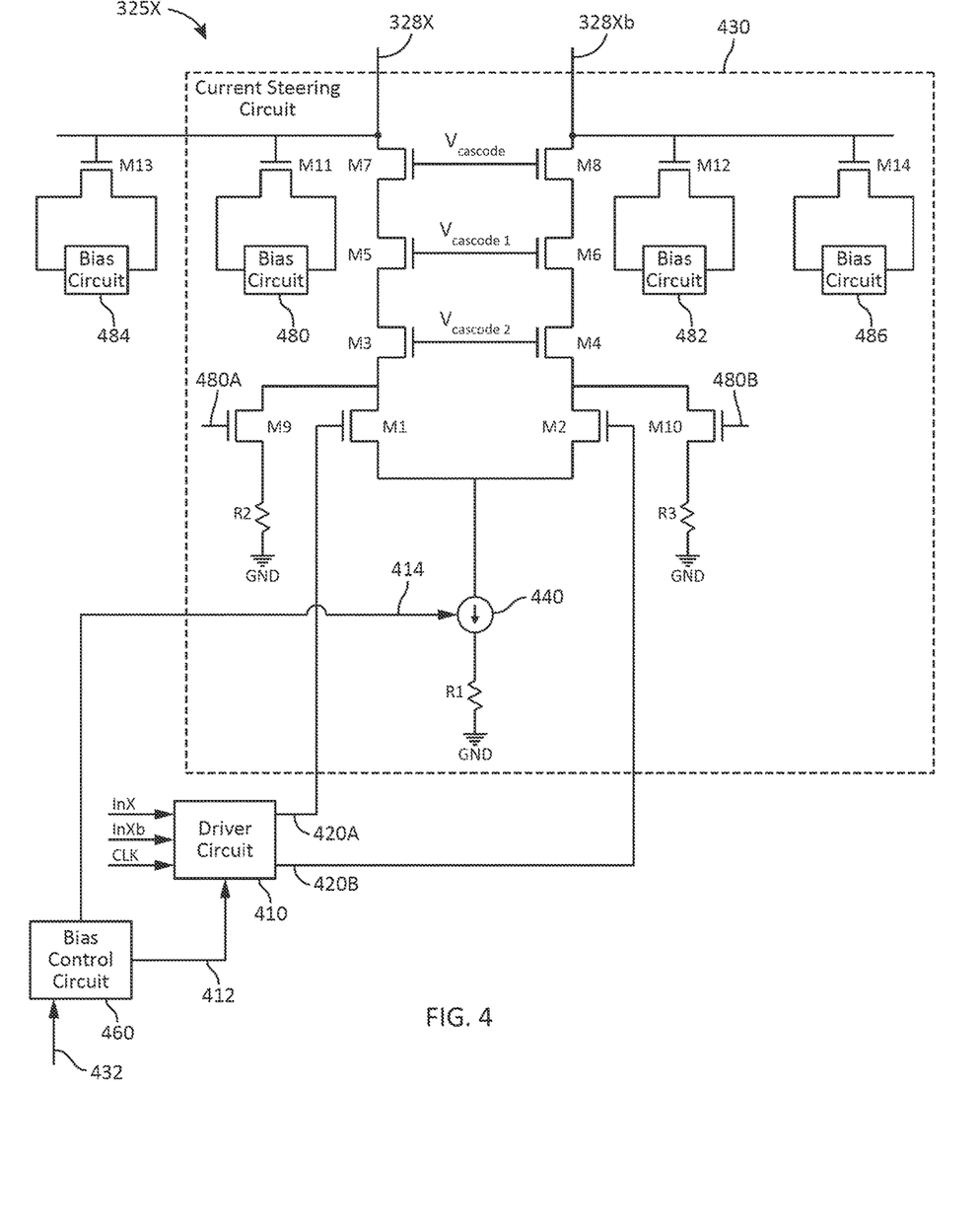
FIG. 4 is a schematic block diagram of a DAC cell for the transmitter illustrated in FIG. 3, in accordance with some embodiments.

FIG. 4 illustrates a schematic diagram of a DAC cell 325X, in accordance with some embodiments. The DAC cell 325X may be one of the DAC cells 325A . . . 325N (FIG. 3). In some embodiments, the DAC cell 325X includes a current steering circuit 430, a driver circuit 410, and a bias control circuit 460. These components may operate together to provide outputs 328X, 328Xb, corresponding to input signals InX, InXb. In some embodiments, the DAC cell 325X includes more, fewer, or different components than shown in FIG. 4. Output 328 can provide a common mode voltage plus output voltage and output 328Xb can provide a common mode voltage minus output voltage in some embodiments.

In one aspect, the input signals InX, InXb may be or may correspond to one of the bits D_A . . . D_B. The input signals InX, InXb may be provided by the modulator 320. The input signals InX, InXb may be differential signals having opposite phases to represent one bit. For example, the input signal InX may have one of a first voltage (e.g., VDD or 1V) or a second voltage (e.g., GND or 0V) lower than the first voltage and the input signal InXb may have the other of the first voltage or the second voltage, according to a value of one bit to represent. For example, the input signal InX having the first voltage and the input signal InXb having the second voltage lower than the first voltage may represent a value '1' of one bit. For example, the input signal InX having the second voltage and the input signal InXb having the first voltage higher than the second voltage may represent a value '0' of one bit.

In some embodiments, the bias control circuit 460 is a circuit or a component that can provide bias voltages to the driver circuit 410 and/or the current steering circuit 430. The bias control circuit 460 may include or may be implemented as one or more logic circuits. The bias control circuit 460 may receive, from the calibrator 350, a configuration signal at input 432 indicating configurations or settings of the DAC cell 325X, and determine one or more bias voltages for the driver circuit 410 and/or the current steering circuit 430, according to the configurations or settings indicated by the configuration signal at input 432. The bias control circuit 460 may provide or apply one or more bias voltages 412 to the driver circuit 410 and one or more bias voltages 414 to the current steering circuit 430, according to configurations or settings indicated by the configuration signal at input 432. For example, for a configuration signal at input 432 indicating the DAC cell 325X to have a particular timing of generating currents or currents or outputs 328X, 328Xb, the bias control circuit 460 may provide one or more bias voltages 412 to the driver circuit 410, such that the driver circuit 410 can have a particular drive strength according to the one or more bias voltages 412 to adjust the timing of generating the outputs 328X, 328Xb. For example, for a configuration signal at input 432 indicating the DAC cell 325X to provide the outputs 328X, 328Xb with a particular amplitude, the bias control circuit 460 may provide one or more bias voltages 414 to the current steering circuit 430, such that the current steering circuit 430 can set or adjust an amplitude of the outputs 328X, 328Xb according to the one or more bias voltages 414. In some embodiments, the bias control circuit 460 can also generate bias voltages $V_{cascode}$, $V_{cascode1}$, $V_{cascode2}$, and provide the bias voltages $V_{cascode}$, $V_{cascode1}$, $V_{cascode2}$ to the current steering circuit 430.

In some embodiments, the driver circuit 410 is a circuit or a component that may provide signals 420A, 420B corresponding to the input signals InX, InXb to the current steering circuit 430, in response to the clock signal CLK. In some embodiments, the driver circuit 410 can include a latch or a flip flop. The driver circuit 410 may also include a level shifter or may be coupled to a level shifter. The level shifter can shift voltage levels of the signals 420A, 420B to have particular voltages amplitudes and/or a common mode voltage suitable for driving the current steering circuit 430. The signals 420A, 420B may be differential signals having opposite phases. In one aspect, the signals 420A, 420B may correspond to one bit represented by the input signals InX, InXb. For example, in response to the input signal InX having a higher voltage than the input signal InXb, the signal 420A may have a higher voltage than the signal 420B. For example, in response to the input signal InXb having a higher voltage than the input signal InX, the signal 420B may have a higher voltage than the signal 420A. In one aspect, the driver circuit 410 receives the input signals InX, InXb and provides the signals 420A, 420B, at a timing indicated by the clock signal CLK. A clock signal CLK may be a signal that toggles between two voltages periodically.

In one aspect, according to a state, a voltage, or an edge of the clock signal CLK, the driver circuit 410 may receive the input signals InX, InXb and provide the signals 420A, 420B to the current steering circuit 430. For example, in response to the clock signal CLK having a first voltage (e.g., VDD or 1V), the driver circuit 410 may receive the input signals InX, InXb, and provide, to the current steering circuit 430, the signals 420A, 420B corresponding to the input signals InX, InXb. For example, in response to the clock signal CLK having a second voltage (e.g., GND or 0V), the driver circuit 410 may not provide, to current steering circuit 430, the signals 420A, 420B corresponding to the input signals InX, InXb.

In one aspect, the driver circuit 410 can set, change or adjust a drive strength to adjust timing of providing the signals 420A, 420B. A drive strength may be an amount of change in a current provided, in response to a change in a voltage applied. In one aspect, the driver circuit 410 can receive one or more bias voltages 412 from the bias control circuit 460, and set or adjust the drive strength, according to the one or more bias voltages 412. According to the drive strength, the driver circuit 410 can change or set timing of generating edges of the signals 420A, 420B.

In some embodiments, the current steering circuit 430 is a circuit or a component that may provide outputs 328X, 328Xb indicative of one bit represented by the input signals InX, InXb. In some embodiments, the current steering circuit 430 includes transistors M1-M10, resistors R1-R3, and an adjustable current source 440. These components may operate together to receive the signals 420A, 420B, and provide the outputs 328X, 328Xb, according to the signals 420A, 420B. In some embodiments, the current steering circuit 430 includes more, fewer, or different components than shown in FIG. 4.

In one aspect, outputs 328X, 328Xb may correspond to one of the outputs 328A . . . 328N. Outputs 328X, 328Xb may be differential signals having opposite phases to indicate a value represented by the input signals InX, InXb. For example, the output 328X being larger or having a larger amplitude than the output 328Xb may correspond to one bit '1' represented by the input signals InX, InXb. For example, the output 328Xb being larger or having a larger amplitude than output 328X may correspond to one bit '0' represented by the input signals InX, InXb.

In one aspect, the resistor R1 and the adjustable current source 440 may operate together to set or adjust an amount or amplitude of outputs 328X, 328Xb. The resistor R1 may be a component that provides a certain resistance. The adjustable current source 440 may be a circuit or a component that provides a current having an amplitude corresponding to one or more bias voltages 414. The adjustable current source 440 may include or may be implemented as one or more transistors. In one configuration, the resistor R1 includes a first electrode coupled to a metal rail providing a ground voltage (e.g., GND or 0V), and a second electrode coupled to the adjustable current source 440. In one configuration, the adjustable current source 440 includes a first port coupled to the driver circuit 410 to receive one or more bias voltages, a second port coupled to the second electrode of the resistor R1, and a third port coupled to the transistors M1, M2. In this configuration, the adjustable current source 440 may conduct current through the resistor R1, according to the one or more bias voltages 414. For example, an amplitude of the current through the resistor R1 may be set or adjusted, according to the one or more bias voltages 414. In one aspect, the current through the resistor R1 may flow through the transistor M1, the transistor M2, or both.

In one aspect, the transistors M1, M2 may operate as a differential pair circuit to steer the current from the adjustable current source 440. The transistors M1, M2 may be MOSFETs, FinFETs, GaaFETs, or any type of transistors. The transistors M1, M2 may be N-type transistors (e.g., N-channel MOSFETs). In some embodiments, the transistors M1, M2 may be implemented as P-type transistors (e.g., P-channel MOSFETs). In one configuration, the transistor M1 includes i) a source electrode coupled to the third port of the adjustable current source 440, ii) a gate electrode coupled to the driver circuit 410 to receive the signal 420A, and iii) a drain electrode coupled to the transistor M3. In one configuration, the transistor M2 includes i) a source electrode coupled to the third port of the adjustable current source 440, ii) a gate electrode coupled to the driver circuit 410 to receive the signal 420B, and iii) a drain electrode coupled to the transistor M4. In this configuration, either the transistor M1 or the transistor M2 can be selectively enabled to steer current from the adjustable current source 440. For example, if the signal 420A has a higher voltage than the signal 420B, then the transistor M1 can conduct or provide a larger portion of the current from the adjustable current source 440 than the transistor M2. For example, if the signal 420B has a higher voltage than the signal 420A, then the transistor M2 can conduct or provide a larger portion of the current from the adjustable current source 440 than the transistor M1. The current conducted or provided by the transistor M1 may be the output 328X, and the current conducted or provided by the transistor M2 may be the output 328Xb. In one aspect, a sum of the outputs 328X, 328Xb may be the current provided by the adjustable current source 440.

In one aspect, the transistors M3-M8 may operate as cascode transistors to protect the transistors M1, M2 (e.g., switch transistors). The transistors M3, M8 may be MOSFETs, FinFETs, GaaFETs, or any transistors. The transistors M3-M8 may be N-type transistors. In some embodiments, some of the transistors M3-M8 may be implemented as P-type transistors or N-type transistors. For example, the transistors M7, M8 may be omitted, the transistors M5-M8 may be omitted, or the transistors M3-M8 may be omitted.

In one configuration, the transistor M3 includes i) a source electrode coupled to the drain electrode of the transistor M1, ii) a gate electrode coupled to a gate electrode of the transistor M4, and iii) a drain electrode coupled to a source electrode of the transistor M5. In one configuration, the transistor M4 includes i) a source electrode coupled to the drain electrode of the transistor M2, ii) a gate electrode coupled to the gate electrode of the transistor M3, and iii) a drain electrode coupled to a source electrode of the transistor M6. Gate electrodes of the transistors M3, M4 may be coupled to the bias control circuit 460 to receive a bias voltage cascade2.

In one configuration, the transistor M5 includes i) a source electrode coupled to the drain electrode of the transistor M3, ii) a gate electrode coupled to a gate electrode of the transistor M6, and iii) a drain electrode coupled to a source electrode of the transistor M7. In one configuration, the transistor M6 includes i) a source electrode coupled to the drain electrode of the transistor M4, ii) a gate electrode coupled to the gate electrode of the transistor M5, and iii) a drain electrode coupled to a source electrode of the transistor M8. Gate electrodes of the transistors M5, M6 may be coupled to the bias control circuit 460 to receive a bias voltage cascade1.

In one configuration, the transistor M7 includes i) a source electrode coupled to the drain electrode of the transistor M5, ii) a gate electrode coupled to a gate electrode of the transistor M8, and iii) a drain electrode coupled to one or more resistors of the resistor ladder 330. In one configuration, the transistor M8 includes i) a source electrode coupled to the drain electrode of the transistor M6, ii) a gate electrode coupled to the gate electrode of the transistor M7, and iii) a drain electrode coupled to one or more resistors of the resistor ladder 330. Gate electrodes of the transistors M7, M8 may be coupled to the bias control circuit 460 to receive a bias voltage cascade.

In this configuration, the transistors M3, M5, M7 operate as cascode transistors coupled to the transistor M1 in series. Similarly, the transistors M2, M4, M6 operate as cascode transistors coupled to the transistor M2 in series. A cascode transistor can help alleviate a voltage stress. In one example, a voltage having an amplitude larger than a tolerable stress voltage of a transistor across a source electrode and a drain electrode of the transistor can damage the transistor. By implementing one or more cascode transistors, a large voltage can be distributed among the transistors connected in series. For example, a voltage between the source electrode of the transistor M1 and the drain electrode of the transistor M7 can be shared or distributed among the transistors M1, M3, M5, M7, such that the transistor M1 can be protected. For example, a voltage between the source electrode of the transistor M2 and the drain electrode of the transistor M8 can be shared or distributed among the transistors M2, M4, M6, M8, such that the transistor M2 can be protected.

In one aspect, the transistor M9 and the resistor R2 may operate together to provide a current to ensure that the cascode transistors M3, M5, M7 operate properly, when a current from the adjustable current source 440 is provided as the output 328Xb through the transistors M2, M4, M6, M8. The current provided by the transistor M9 and the resistor R2 may be referred to as a bleeding current. The bleeding current may be 5~10% of the current provided by the adjustable current source 440. The transistor M9 may be a MOSFET, a FinFET, a GaaFET, or any transistor. The transistor M9 may be an N-type transistor. In some embodiments, the transistor M9 may be implemented as a P-type transistor. In one configuration, the resistor R2 includes a first electrode coupled to a metal rail providing a ground voltage (e.g., GND or 0V), and a second electrode coupled to a source electrode of the transistor M9. In one configuration, the transistor M9 includes i) a source electrode coupled to the second electrode of the resistor R2, ii) a gate electrode to receive a signal 480A, and iii) a drain electrode coupled to the drain electrode of the transistor M1. The signal 480A may be or correspond to the signal 420B. In this configuration, the transistor M9 can operate as a switch. For example, when the signal 420B has a higher voltage than the signal 420A, such that the current from the adjustable current source 440 flows through the transistors M2, M4, M6, M8 as the output 328Xb, the transistor M9 can be enabled to provide a lower amount of current (or bleeding current) sufficient to ensure that the transistors M3, M5, M7 operate properly. For example, when the signal 420A has a higher voltage than the signal 420B, such that the current from the adjustable current source 440 flows through the transistors M1, M3, M5, M7 as the output 328X, the transistor M9 can be disabled from providing a current (or bleeding current).

In one aspect, the transistor M10 and the resistor R3 may operate together to provide a current to ensure that the cascode transistors M4, M6, M8 operate properly, when a current from the adjustable current source 440 is provided as the output 328X through the transistors M1, M3, M5, M7. The current provided by the transistor M10 and the resistor R3 may be referred to as a bleeding current. The transistor M10 may be a MOSFET, a FinFET, a GaaFET, or any transistor. The transistor M10 may be an N-type transistor. In some embodiments, the transistor M10 may be implemented as a P-type transistor. In one configuration, the resistor R3 includes a first electrode coupled to a metal rail providing a ground voltage (e.g., GND or 0V), and a second electrode coupled to a source electrode of the transistor M10. In one configuration, the transistor M10 includes i) a source electrode coupled to the second electrode of the resistor R3, ii) a gate electrode to receive a signal 480B, and iii) a drain electrode coupled to the drain electrode of the transistor M2. The signal 480B may be or correspond to the signal 420A. In this configuration, the transistor M10 can operate as a switch. For example, when the signal 420A has a higher voltage than the signal 420B, such that the current from the adjustable current source 440 flows through the transistors M1, M3, M5, M7 as the output 328X, the transistor M10 can be enabled to provide a lower amount of current (or bleeding current) sufficient to ensure that the transistors M4, M6, M8 operate properly. For example, when the signal 420B has a higher voltage than the signal 420A, such that the current from the adjustable current source 440 flows through the transistors M2, M4, M6, M8 as the output 328Xb, the transistor M10 can be disabled from providing a current (or bleeding current). Transistors M3-M8 have a non-linear characteristic of capacitance. Transistors M3-M8 embodied as MOSFETs have parasitic gate drain capacitance due in part to the gate insulator. Parasitic gate drain capacitance can be caused by overlap and junction capacitances. Parasitic gate drain capacitance is affected by voltage, temperature and processing variations and causes nonlinearities in some embodiments.

In some embodiments, transistors M11 and M12 are provided to compensate for nonlinearities associated with at least one of transistors M3-M8. Transistors M3-M8 can be biased by cascode signals ($V_{cascode}$, $V_{cascode1}$, $V_{cascode2}$). In some embodiments, transistor M11 is provided and biased to compensate for the last cascode transistor M7, and transistor M12 is provided and biased to compensate for the last cascode transistor M8. Transistors M11 and M12 are the same type of transistor as transistors M7 and M8 (e.g., N-channel transistors). Transistor M11 is disposed with its gate coupled to output 328X associated with the common mode voltage and output voltage (positive), and transistor M12 is disposed with its gate coupled to output 328Xb associated with the common mode voltage and output voltage (negative). In some embodiments, tracking of this compensation over PVT corners is realized by using the same device type for the output cascode transistors (e.g., transistors M7 and M8) and the compensation capacitors ((e.g., transistors M11-M13) and by having the bias voltages of the compensation capacitors track the output common-mode voltage.

In some embodiments, transistors M11 and M12 are active devices or elements that have a capacitive response (e.g., MOSFET transistors configured as capacitors). Active devices or elements are any type of non-passive semiconductor devices. In some embodiments, transistors M11 and M12 are capacitive elements having a capacitive nonlinear response configured or selected to inversely match or track the response of transistors M7 and M8, respectively.

Bias circuits 480 and 482 are coupled to the drain and source of respective transistors M11 and M12. In some embodiments, the source and drain of M11 are connected together, and that common node is connected to the bias circuit 480. In some embodiments, the source and drain of M12 are connected together, and that common node is connected to the bias circuit 482. Bias circuits 480 and 482 are current source/resistive ladder circuits or other circuits configured to bias transistors M11 and M12. In some embodiments, bias circuits include a resistor and a current source coupled to output common mode voltage such that the bias is referenced to the common mode voltage. Transistors M11 and M12 are biased in a non-linear region to reduce the nonlinear performance associated with the parasitic capacitance ($C_{dg}$) of respective transistors M11 and M12 (e.g., the injection of nonlinear current into outputs 328X and 328Xb leading to distortion (SFDR and IMD)). In some embodiments, the transistors M11 and M12 have a response such that the parasitic capacitance increases as voltage at outputs 328X and 328Xb increases which is opposite to the response of the parasitic capacitance ($C_{dg}$) of respective transistors M11 and M12 which decreases as the voltage increases. The effect exists across the output voltage swing at outputs 328X and 328Xb. In some embodiments, bias circuits 480 and 482 are configured to track the output voltage at outputs 328X and 328Xb (e.g., the common mode voltage). The doping, size, and other characteristics of transistors M11 and M12 can be chosen for the appropriate non-linear performance. In some embodiments, the capacitive-voltage response of transistors M11 and M12 have the opposite voltage coefficients than the response of transistors M11 and M12. In some embodiments, the capacitive-temperature response of transistors M11 and M12 have the opposite temperature coefficients than the response of transistors M11 and M12.

In some embodiments, transistors M13 and M14 are provided for additional compensation for non-linearity associated with at least one of transistors M3-M8 and transistors M11 and M12. In some embodiments, transistor M13 is provided and biased to compensate for transistor M11, and transistor M14 is provided and biased to compensate for transistor M12. Transistors M13 and M14 are the same type of transistor as transistors M11 and M12 (e.g., N-channel transistors). Transistor M13 is disposed with its gate coupled to output 328X associated with the common mode voltage and output voltage (positive), and transistor M14 is disposed with its gate coupled to output 328Xb associated with the common mode voltage and output voltage (negative). In some embodiments, transistors M13 and M14 are active devices or elements that have a capacitive response (e.g., MOSFET transistors configured as capacitors). In some embodiments, transistors M13 and M14 are capacitive elements having a capacitive nonlinear response configured or selected to inversely match the response of transistors M11 and M12, respectively.

Bias circuits 484 and 486 are coupled to the drain and source of respective transistors M13 and M14. In some embodiments, the source and drain of transistor M13 are connected together, and that common node is connected to the bias circuit 484. In some embodiments, the source and drain of M14 are connected together, and that common node is connected to the bias circuit 486. Bias circuits 484 and 486 are resistive ladder or other circuits configured to bias transistors M13 and M14. Transistors M11 and M12 are biased in a non-linear region to reduce the nonlinear performance associated with the parasitic capacitance ($C_{dg}$) of respective transistors M13 and M14. The doping, size, and other characteristics of transistors M13 and M14 can be chosen for the appropriate non-linear performance. In some embodiments, transistors M11-M14 are smaller than transistors M7 and M8, and the combined responses of transistors M11-M14 compensates for the responses of transistors M8 and M9. In some embodiments, transistors M13 and/or M14 are smaller than the combined size of all transistors M7 and M8 of all DAC cells 325A-N (FIG. 4) combined. In some embodiments, transistors M13 and M14 compensate for the combined nonlinearity of all M7 and M8 transistors combined over all DAC cells.

Figure 5:
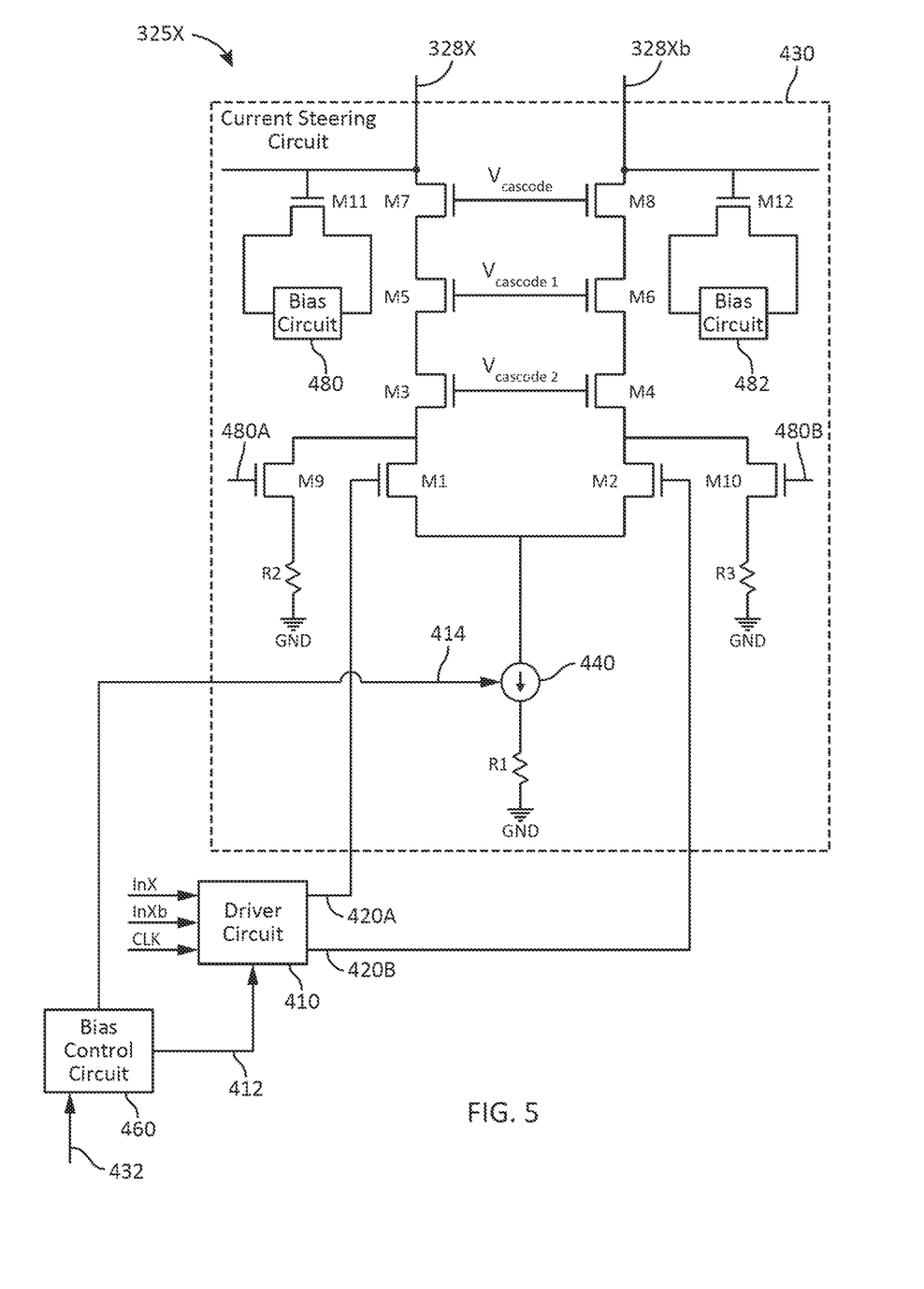
FIG. 5 is a schematic block diagram of a DAC cell for the transmitter illustrated in FIG. 3, in accordance with some embodiments.
Figure 6:
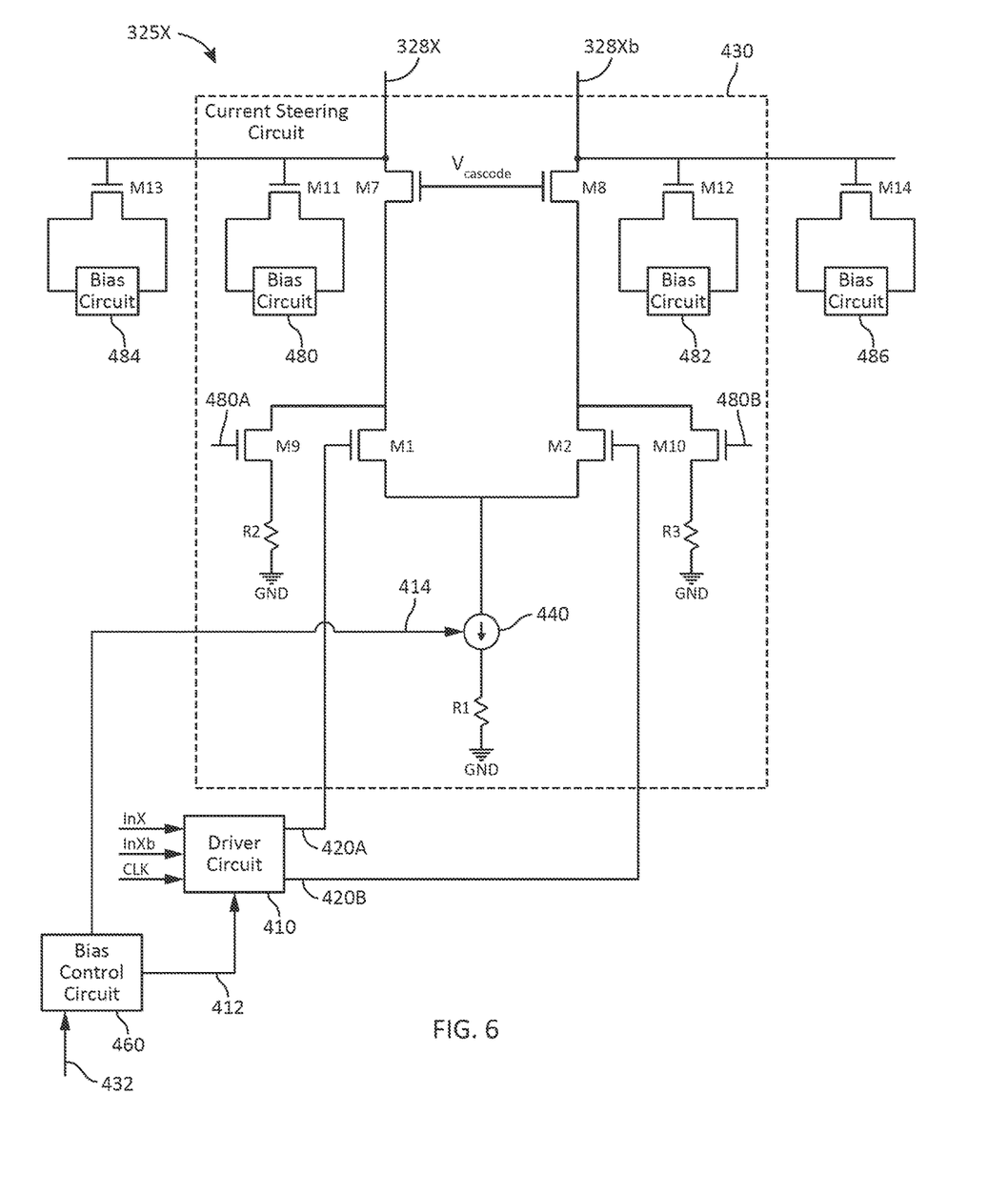
FIG. 6 is a schematic block diagram of a DAC cell for the transmitter illustrated in FIG. 3, in accordance with some embodiments.
Figure 7:
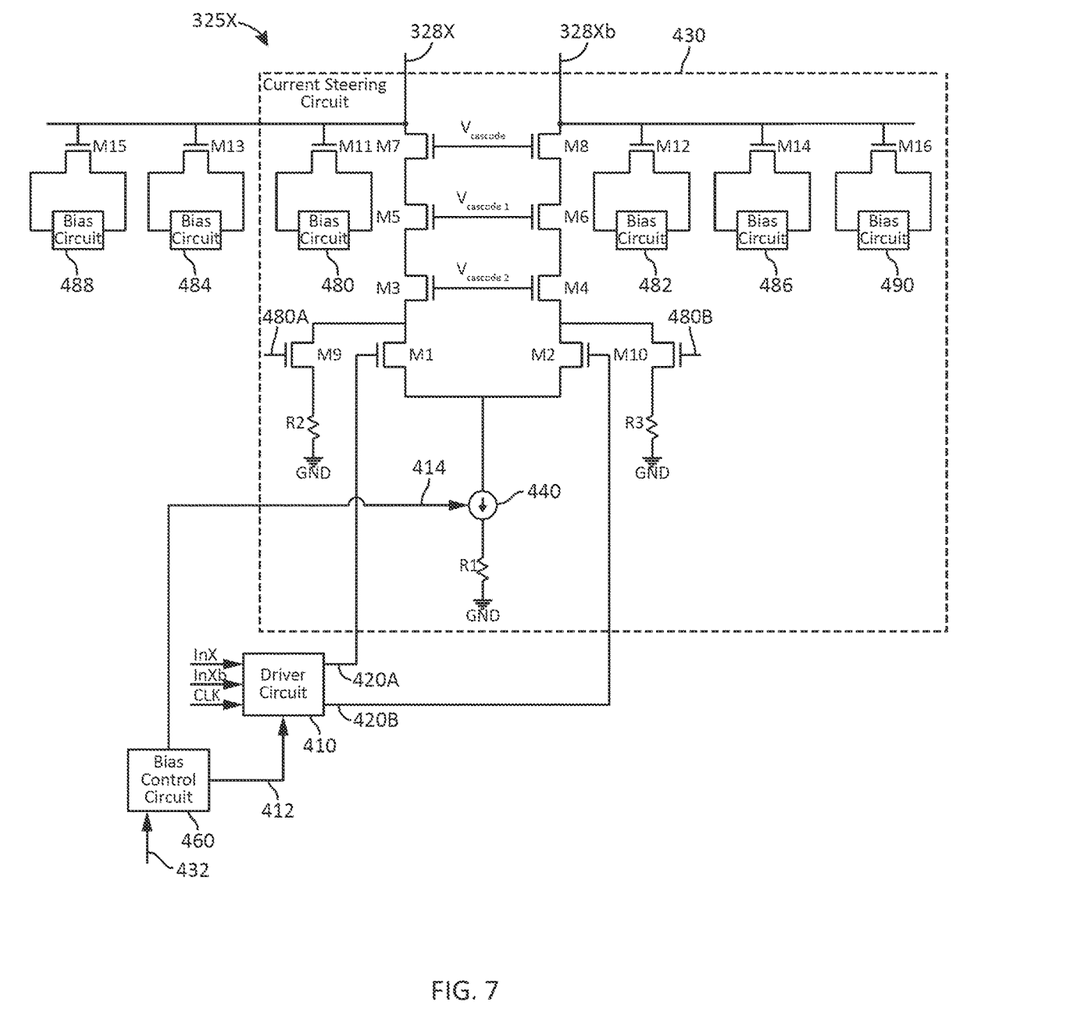
FIG. 7 is a schematic block diagram of a DAC cell for the transmitter illustrated in FIG. 3, in accordance with some embodiments

With reference to FIG. 5, cell 325X is similar to cell 325X of FIG. 5 but does not include transistors M13 and M14. With reference to FIG. 6, cell 325X is similar to cell 325X of FIG. 5, but does not include transistors M3, M4, M5, and M6. Any number of cascode transistors can be utilized. In addition, cell 325X in FIG. 6 can be provided without transistors M13 and M14 in some embodiments. With reference to FIG. 7, additional transistors M15 and M16 similar to transistors M13 and M14 can be added to provide finer adjustments to the capacitive response in some embodiments. Any number of additional transistors M15 and M16 can be provided depending upon design criteria, desired capacitive response and system criteria. Additional transistors M15 and M16 are coupled to bias circuits 488 and 490 in a fashion similar to transistors M13 and M14 that are coupled to bias circuits 484 and 486 in some embodiments. In some embodiments, transistors M11-M16 are located outside of cell 325X. In some embodiments, transistors M11 and M12 are located within cell 325X and transistors M13-16 are located outside of cell 325X.

The transistors describe above can be any type of transistors including field effect transistors FETS, insulated gate FETs, bipolar junction transistors, etc. In some embodiments, the transistors are P-channel or N-channel metal oxide semiconductor field effect transistors (MOSFETs). A P-channel transistor includes a P channel, which is a channel composed of a majority of hole current carriers, between its source and drain. An N-channel transistor includes an N channel, which is a channel composed of a majority of electron current carriers, between its source and drain.

In the above description, for the purposes of explanation, numerous details are set forth to provide a thorough understanding of the described embodiments. It will be apparent to one skilled in the art, however, that other embodiments may be practiced without some of these details. In other instances, structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Similarly, when an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Furthermore, the methods and processes discussed herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

The hardware system may be implemented in many different ways and in many different combinations of hardware and software and circuit designs. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof.

The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples. In some embodiments, the circuitry for calibration operations and the cells can be provided on one or more integrated circuit dies in an integrated circuit package. The integrated circuit package can be a combination of two or more packages in some embodiments.

The circuitry may further include or access instructions (e.g., software or firmware) for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

Various implementations have been specifically described. However, many other implementations are also possible.

What is claimed is:

1. A converter, comprising:
a plurality of unit cells, wherein the unit cells each comprise a first transistor and a second transistor, wherein the first transistor is coupled in series with an output of a unit cell and wherein the second transistor is configured to have a capacitive characteristic that reduces a non-linear capacitive characteristic of the first transistor wherein a gate of the second transistor is coupled to the output and a bias circuit is coupled between a drain of the second transistor and a source of the second transistor.

2. The converter of claim 1, wherein the unit cells are voltage or current mode digital to analog converter cells.

3. The converter of claim 1, wherein the first transistor and the second transistor are each N-channel transistors or are each P-channel transistors.

4. The converter of claim 1, wherein a gate of the second transistor is coupled to the output.

5. The converter of claim 1, wherein a gate of the second transistor is coupled to the output and a bias circuit is coupled to a drain of the second transistor and source of the second transistor, the drain and the source being coupled together.

6. The converter of claim 1, wherein a bias circuit is coupled to the second transistor and the bias circuit receives a signal at the output.

7. The converter of claim 1, wherein the non-linear capacitive characteristic of the first transistor is associated with a parasitic gate drain capacitance.

8. The converter of claim 1, wherein the unit cells each comprise a third transistor, wherein the third transistor is coupled to another output of the unit cell and wherein the third transistor is configured to have a capacitive characteristic that reduces a non-linear capacitive characteristic of the second transistor.

9. The converter of claim 1, wherein the first transistor is a cascode transistor.

10. The converter of claim 1, wherein the unit cells each comprise a third transistor coupled in series with the first transistor, wherein the first transistor and the third transistor are cascode transistors and the first transistor is between the third transistor and the output.

11. A converter, comprising:
a plurality of unit cells, wherein the unit cells each comprise a first transistor, a second transistor, a third transistor, a fourth transistor, a first capacitive element and a second capacitive element, the first transistor being configured to drive a signal at a first output, the second transistor being configured to drive a signal at a second output, wherein the third transistor is configured to reduce an output swing experienced by the first transistor, wherein the fourth transistor is configured to reduce an output swing experienced by the second transistor, wherein the first capacitive element is configured to have a capacitive characteristic that reduces a non-linear capacitive characteristic of the first transistor, wherein the second capacitive element is configured to have a capacitive characteristic that reduces a non-linear capacitive characteristic of the second transistor.

12. The converter of claim 11, wherein the unit cells are current mode digital to analog converter cells and wherein the first capacitive element and the second capacitive element are each N-channel transistors or are each P-channel transistors.

13. The converter of claim 12, wherein a gate of the first capacitive element is coupled to the first output and a first bias circuit is coupled between a drain of the first capacitive element and source of the second capacitive element.

14. The converter of claim 13, wherein a gate of the second capacitive element is coupled to the second output and a second bias circuit is coupled between a drain of the second capacitive element and a source of the second capacitive element.

15. The converter of claim 14, wherein the first capacitive element and the second capacitive element are N-channel transistors.

16. A method of reducing a nonlinear capacitive response of converter, comprising:
a plurality of unit cells, wherein the unit cells each comprise a first transistor and a second transistor, wherein the first transistor is coupled in series with a first output of a unit cell, wherein the second transistor is coupled in series with a second output of the unit cell, the method comprising:
biasing a first active element so that the first active element has a capacitive characteristic that reduces a non-linear capacitive characteristic of the first transistor; and
biasing a second active element so that the second active element has a capacitive characteristic that reduces a non-linear capacitive characteristic of the second transistor.

17. The method of claim 16, wherein the first active element is a transistor configured as a capacitor.

18. The method of claim 16 further comprising:
biasing a third active element so that the third active element has a capacitance characteristic that reduces a non-linear capacitive characteristic of the first active element and the non-linear capacitive characteristic of the first transistor.

19. The method of claim 16, wherein the first active element is biased using an output signal at the first output.

* * * * *